United States Patent [19]
Döhler

[11] 3,882,533
[45] May 6, 1975

[54] SEMICONDUCTOR DEVICE

[75] Inventor: Gottfried Heinrich Döhler, Nurtingen, Germany

[73] Assignee: Max-Planck-Gesellschaft zur Förderung der Wissenschaften e.V., Gottingen, Germany

[22] Filed: July 2, 1973
(Under Rule 47)

[21] Appl. No.: 375,534

[30] Foreign Application Priority Data
Dec. 15, 1972 Germany .......... 2261527

[52] U.S. Cl. .......... 357/58; 357/88; 357/17; 357/29
[51] Int. Cl. .......... H05b 33/00
[58] Field of Search .......... 357/30, 58, 88, 18, 17

[56] References Cited
UNITED STATES PATENTS

| | | | |
|---|---|---|---|
| 3,514,715 | 5/1970 | Kosonocky | 331/94.5 |
| 3,626,238 | 12/1971 | Esaki | 331/107 G |
| 3,626,257 | 12/1971 | Esaki | 317/234 |

*Primary Examiner*—Martin H. Edlow
*Attorney, Agent, or Firm*—Spencer & Kaye

[57] ABSTRACT

A semiconductor device including a body of semiconductor material having a given energy gap and lattice constant and a plurality of zones which, in a given direction, constitute a succession of alternatingly n-conductive and p-conductive zones having a given excess of donors and acceptors respectively, and each having a thickness in the given direction which is less than $10^3$ times the lattice constant. The actual thicknesses and doping concentrations of the p-conductive and n-conductive zones being such that the amplitude and spatial period of the wave-type potential distributions produced by the alternating conductivity type zone is of such a magnitude that the interaction effect between states in adjacent zones is small.

23 Claims, 9 Drawing Figures

SEMICONDUCTOR DEVICE

BACKGROUND OF THE INVENTION

The present invention relates to a semiconductor device having a preferably monocrystalline body consisting of a semiconductor material with a given energy gap and a given lattice constant, and having a plurality of sequential zones of alternating n-type and p-type conductivity in a given direction each exhibiting a given excess of donors or acceptors respectively and a thickness in the given direction which is less than $10^3$ times the lattice constant.

Semiconductor devices which have a negative resistance characteristic (current-voltage characteristic with at least one region corresponding to a negative resistance) are known in the art and contain a body of a semiconductive monocrystal whose crystal lattice is provided, either during the growing of the crystal or by periodic doping with donors and acceptors and the corresponding formation of alternating layers of opposite conductivity types, with a periodic "superstructure" (L. Esaki and R. Tsu, IBM Journal Res. Developm. 14, 61 (1970) ). It has been possible with the known techniques to obtain superstructures with period durations of as low as about 200 A and more than 100 periods. One of the significant conditions for the desired occurrence of a negative resistance characteristic is a sufficiently low superstructure lattice constant or very high transition probabilities ($\approx 1$) between adjacent layers since, roughly stated, the tunnel transitions from layer to layer are intended to lie below times in the order of magnitude of $10^{-10}$ seconds and the average free path length of the electrons must be long compared to the length of the spatial period of the superstructure (superstructure lattice constant). The use of such devices is thus relatively limited.

Semiconductor devices are also known which contain a plurality of layers with different doping. The thickness of the doping layers or the concentration of the doping atoms is thus always relatively large.

SUMMARY OF THE INVENTION

It is the object of the present invention to provide a novel semiconductor device which is suited for a plurality of uses including the production and absorption of light of variable wavelengths, control of conductivity with low control energy, longtime storage of light energy and the like.

According to the present invention this is accomplished by providing a semiconductor device having a body of semiconductor material having a given energy gap and lattice constant and having a plurality of successive zones, in a given direction, of alternating p-type and n-type conductivity each having a given excess of donors or acceptors respectively and a thickness in the given direction which is less than $10^3$ times the lattice constant, and by selecting or adjusting the thicknesses and doping concentrations of the zones so that the amplitude and spatial period of the wave-like potential distributions produced by the alternatingly p-conductive and n-conductive zones are so great that the interaction effect between states remains small in the adjacent zones.

In other words, the number $n_D^{(2)} = n_D d_n$ or $n_A^{(2)} = n_A d_p$ (see Appendix to specification for definition of symbols used throughout the specification) of the donors and acceptors contained in an n-conductive or p-conductive zone, respectively, per unit area must be, at most, of the same order of magnitude, but are preferably substantially smaller, than the number required to build up a space charge potential by means of ionized doping atoms at the level of the energy gap $E_g$ of the material.

That is, in the known case the following applies:

$$(4\pi n_D e^2/2\epsilon)\,[d_n/2]^2 >> (E_g/2) \quad (1a)$$

and $$(4\pi n_A e^2/2\epsilon)\,[d_p/2]^2 >> (E_g/2) \quad (1b)$$

According to the present invention, however, at least one of the two following expressions $$[2\pi n_D^{(2)} e^2/\epsilon] \cdot (d/2) \quad (2a)$$

$$[2\pi n_A^{(2)} e^2/\epsilon] \cdot (d/2) \quad (2b)$$

has at most the same order of magnitude as the energy gap $E_g$. Preferably one or both expressions are smaller, particularly much smaller (e.g., by a factor $0.8$–$10^{-2}$) than the energy gap $E_g$ between the upper edge of the valence band and the lower edge of the conduction band.

BRIEF DESCRIPTION OF THE DRAWINGS

FIG. 1a is a schematic representation of an embodiment of a semiconductor device according to the present invention with a modification shown in dashed lines.

FIG. 1b shows a model of the bands for the semiconductor device shown in FIG. 1a.

FIG. 1c is a graphic representation of the donor or acceptor concentration, respectively, in the semiconductor device of FIG. 1a.

FIG. 1d is a graphic representation of the space charge distribution in the semiconductor device of FIG. 1a.

DESCRIPTION OF THE PREFERRED EMBODIMENTS

Figures 1A, 1B, 1C, 1D:
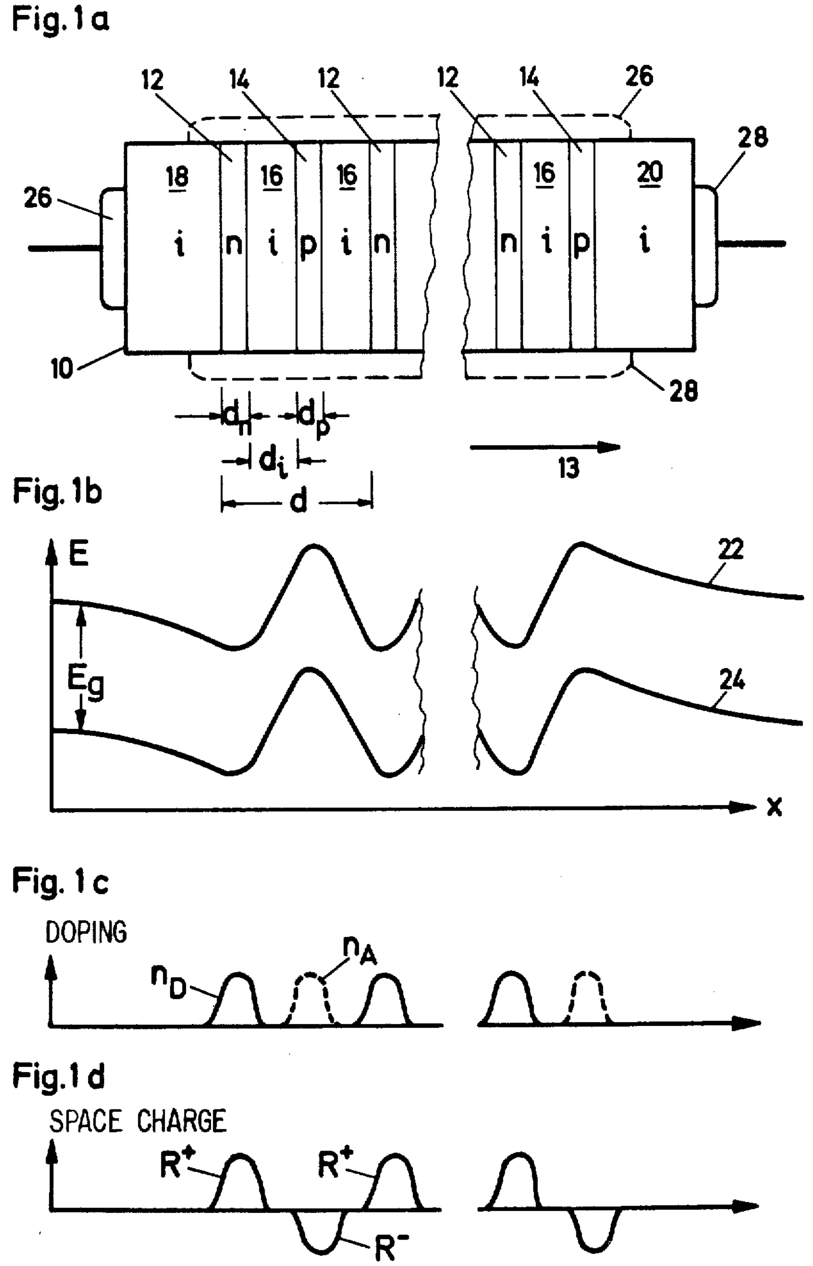

The semiconductor device shown in FIG. 1a contains a body 10 of a semiconductor monocrystal, e.g., germanium, silicon or an $A_{III}B_V$ compound.

The monocrystalline body 10 contains a plurality of n-conductive zones 12 which may be planar and alternate in a given direction, shown by arrow 13, with p-conductive zones 14. In the preferred embodiment of the present invention shown in FIG. 1a an intrinsic zone 16 is disposed between each adjacent n-conductive and p-conductive zone 12 or 14. The thicknesses of the zones 12 and 14 is less than $10^3$ times and preferably no more than 30 times the lattice constant and is at least 5 times and preferably 10 times the lattice constant, while the thickness of the intrinsic zones 16 is at least 10 times the lattice constant. In the present embodiment this intrinsic zone 16 has a thickness which is twice the thickness of the n-conductive and p-conductive zones which each have the same thickness.

The doping concentrations per unit area of the zones 12 and 14 are such that at least one of the quantities (2a) or (2b) above has at most the same order of magnitude as the energy gap $E_g$ of the semiconductor material. Preferably both expressions are smaller, and in particular are much smaller than the energy gap, i.e., less than one-tenth.

Preferably, the periodic structure consisting of zones 12, 14 and 16 begins, when seen in direction 13, with a zone of the one conductivity type, e.g., an n-conductive zone 12, and it ends with a zone of the opposite conductivity type, e.g., a p-conductive zone 14. The periodic structure may, as illustrated, be enclosed between two outer intrinsic zones 18, 20 or between two zones in which the excess of donors or acceptors is one half that of the adjacent zones 12 or 14, respectively. These outer or "framing" zones may each be of the same conductivity type or of the opposite conductivity type as the adjacent zone 12 or 14, respectively. Preferably, in the case where p-conductive or n-conductive framing zones are utilized, an intrinsic zone is provided between the framing zone and the associated zone 12 or 14, respectively. The semiconductor body 10 of FIG. 1*a* is provided with a pair of ohmic contact electrodes 26 and 28, which are connected to the outer zones 18 and 20 whereby a voltage may be applied to the body 10 in the direction 13.

FIG. 1*b* shows a model of the bands for the semiconductor device of FIG. 1*a*, with the same scale being used for the abscissa, which indicates the locus along the direction 13, in FIG. 1*b* (and in subsequent FIGS. 1*c* and 1*d*) as was used in FIG. 1*a*. The lower edge of the conduction band is marked 22 and the upper edge of the valence band is marked 24.

In the region of the periodic doping, the band edges 22 and 24 in FIG. 1*b* follow the periodic parallel path shown schematically in FIG. 1*b* as long as no voltage is applied to the ohmic electrodes 26 and 28, respectively. This path is produced as follows: as long as the n-conductive zones 12 contain electrons which are bound to donors or are disposed in the conduction band, and the p-conductive zones 14 contain holes (hole electrons) which are bound to acceptors or disposed in the valence band, the electrons from the n-conductive zones 12 recombine with holes from the p-conductive zones 14 if this produces a gain in energy. This leads, as shown in FIG. 1*d*, to a positive space charge $R^+$ in the n-conductive zones 12 and to a negative space charge $R^-$ of the same size in the p-conductive zones 14 and to the build-up of a space charge potential $V_i$ between these zones, which is given in approximation by $$V_i \approx [2\pi n_i^{(2)} e^2/\epsilon] \cdot (d/2) \qquad (3)$$

Since the number of ionized doping atoms per zone is at most equal to the number of doping atoms present in the respective zone, $n_i^{(2)}$ is at most of the same size as the smaller of the two values $n_D^{(2)}$ and $n_A^{(2)}$. Thus, if at least one of the doping substances for the opposite conductivity type is contained in the associated zones only in a correspondingly low concentration, $V_i < E_g$ will result for the basic state and these "minority layers" no longer contain any charge carriers in the basic state.

Only when the smaller of the two values $n_D^{(2)}$ and $n_A^{(2)}$ $\gtrsim (E_g \cdot \epsilon)/(\pi e^2 d)$ is the basic state of the system determined by the fact that the recombination of electrons with holes no longer produces energy. In this case the n-conductive zones 12 still contain electrons in the basic state and the p-conductive zones 14 contain holes.

Deviations from the basic state can also be obtained by a bias applied by means of electrodes 26 and 28 or by absorption of photons or by thermal excitation.

Figure 2:
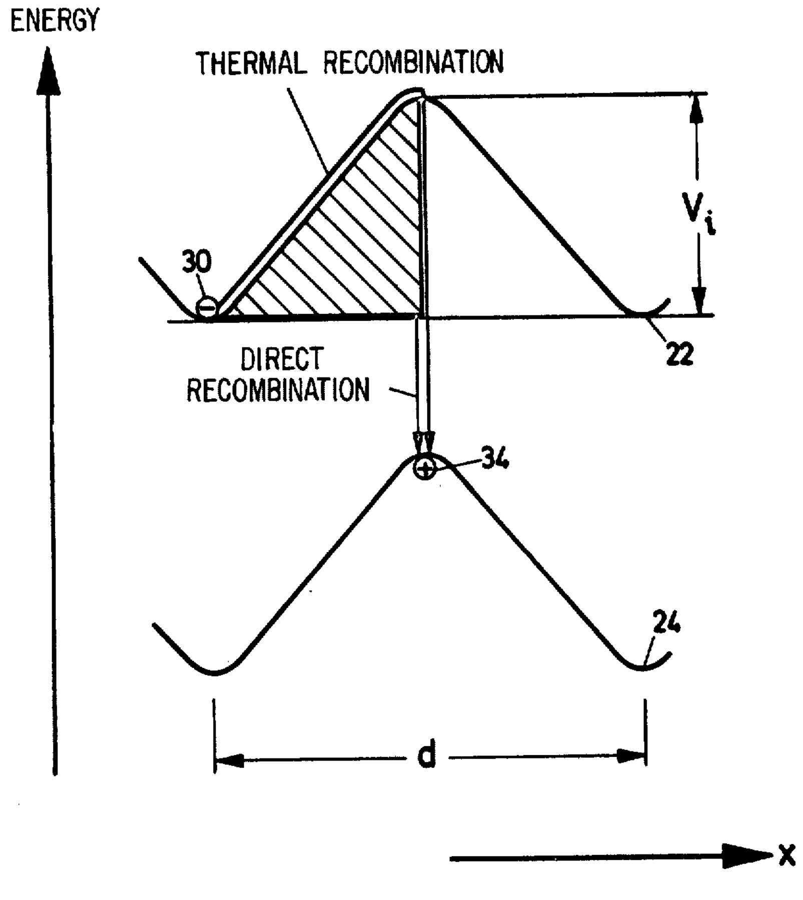
FIGS. 2 to 6 show models of the bands for various embodiments or applications, respectively, of semiconductor devices according to the present invention.

A particularly important characteristic of the present semiconductor devices is that it is possible to maintain a presence in the n-conductive and p-conductive zones 12 and 14 of electrons or holes, respectively, which deviates in a desired manner from the thermal equilibrium, over practically any desired period of time. If, for example, pairs of electrons and holes are produced by optical excitation in the region of the periodic superstructure, or if electrons and holes are injected with the aid of electrodes 26' or 28', respectively, laterally into the n-conductive or p-conductive zones, respectively, most of the electrons will relax into donor states or lower level conduction band states in the n-conductive zones 12 while most of the holes relax into acceptor states or higher level valence band states in the p-conductive zones 14 before they recombine. Although recombination is not impossible in practice, it is more or less difficult. This can be seen by reference to FIG. 2. As shown, an electron 30 at the lower edge 22 of the conduction band can, according to the classical point of view, not enter the region 32 of "forbidden" energy states and thus remains spatially separated from the holes 34 at the upper edge 24 of the valence band. According to the classical point of view, the electron 30 can thus recombine with a hole only when it has received, either thermally or by absorption of a photon, the necessary energy which is about $\approx V_i$. As long as the average thermal energy $kT$ is substantially less than $V_i$, the probability for such occurrences is known to be reduced, with respect to the unimpeded recombination, by approximately the extremely small Boltzmann factor $\exp(-V_i/kT)$. Another possibility for recombination is given by the tunnel effect since the electrons as well as the holes have, even though slight, a probability of dwelling in the forbidden zone 32. In this case the recombination probability is reduced with respect to the unimpeded recombination in the normal crystal approximately by the factor $$\exp\{-2/3\,[(\bar{m} V_i d^2)/\hbar^2]^{1/2}\} \qquad (4)$$

which in the semiconductor devices according to the invention is much less than 1, e.g., less than $10^{-2}$.

EXAMPLE 1

For a germanium device ($\epsilon = 16$, $\bar{m} \approx 0.12 m_{electron}$) constructed as shown in FIG. 1*a* and having $V_i = 0.5$ *eV* and $d = 500$A, which corresponds to a value $n_i^{(2)} = 3.5 \cdot 10^{12}\ cm^{-2}$, there results, for example, a reduction factor of about $10^{-15}$. The recombination rates should then lie, for $n^{(2)} = 10^{12} cm^{-2}$ electrons and holes per n-conductive zone 12 or p-conductive zone 14, respectively, approximately in the order of magnitude of from $10^4$ to $10^6$ recombinations per second and unit area per zone.

Due to the exponential dependence of the recombination on the temperature, on $V_i$ and on $d$, the recombination probability can be varied within widest limits by relatively slight changes in these values so that a broad field is made available for possible applications for the present devices.

EXAMPLE 2

If in Example 1 the value of $d = 500$A is replaced by $d = 250$A, the recombination rate increases by about eight powers of ten to $10^{12} \ldots 10^{14}\, s^{-1}cm^{-2}$ per zone. On the other hand, a doubling of the period length $d$ to $10^3$A results in a reduction by 15 powers of ten to $10^{-9} \ldots 10^{-11}\, s^{-1}cm^{-2}$ per zone, so that recombinations become practically impossible due to the tunnel effect.

A further significant characteristic of the present semiconductor devices is the possibility of influencing within wide limits the value $V_i$ in a given device having a doping superstructure by producing or destroying electron and hole pairs. According to equation (3), $V_i$ depends on $d$, $\epsilon$ and the number $n_i^{(2)}$ of the ionized doping atoms per zone. While with the correspondingly high donor and acceptor concentrations $V_i$ can be maximally approximately equal to $E_g$, at low doping concentrations, which are preferably used in this case, $V_i$, as already mentioned, is upwardly limited by the condition $n_i^{(2)}$ minimum $n_D^{(2)}$, $n_A^{(2)}$. However, if $n^{(2)}$ electrons and holes are brought into each n-conductive or p-conductive zone, respectively, they have a very long life under certain circumstances, as mentioned above. With these electrons and holes, however, the number of ionized doping atoms is simultaneously reduced by $n^{(2)}$ per zone so that $V_i$ is reduced by the amount $[2\pi e^2 n^{(2)}/\epsilon] \cdot (d/2)$, i.e., proportional to $n^{(2)}$.

This has two consequences, in particular, for the electronhole recombination: on the one hand, the reduction of $V_i$ according to equation (4) produces a possibly drastic increase in the recombination probability, while on the other hand it simultaneously results in an increase of the energy released during the recombination which for radiating transitions or junctions corresponds to a blue shift of the emitted light. Since $V_i$ cannot change its sign, the emission is always shifted toward "red" to a greater or lesser extent compared to the emission from the pure material.

EXAMPLE 3

In a semiconductor device of the type described in Example 1, $1.75 \cdot 10^{12}\, cm^{-2}$ electrons and holes per n-conductive or p-conductive zone would reduce the value of $V_i$ to half and thus the recombination speed for tunnel transitions would be increased, according to equation (4) by about the factor $3 \cdot 10^4$. At the same time the energy of the emitted photons would be increased by 0.25 $e$V, the color of the emitted light would shift toward blue by the corresponding amount.

Figure 3:
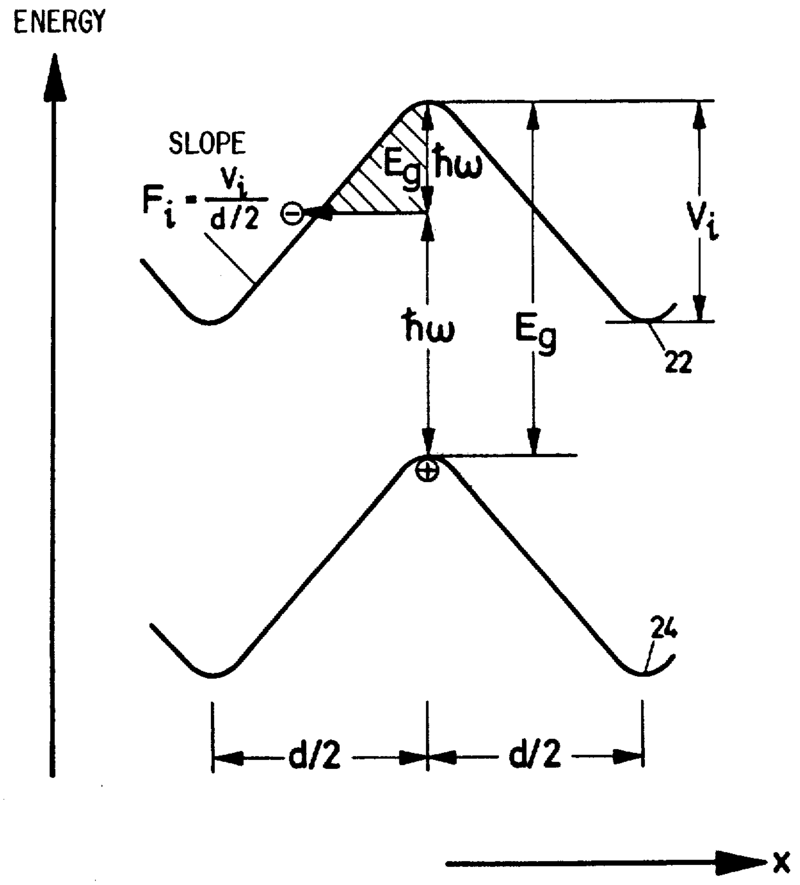

A further characteristic, which principally distinguishes the present semiconductor devices from undoped crystals, as well as from the conventional semiconductor devices having a plurality of doped zones, is the absorption index $\alpha$. This will be explained with the aid of FIG. 3.

According to the classical point of view, an electron can be brought from the valence band state to the conduction band only when it receives energy $\hbar\omega \geqslant E_g$ by absorption of a photon with the corresponding energy. Due to the tunnel effect, however, a valence band/conduction band transition is possible also with low photon energy if the tunnel is made through the region of forbidden energy which is shown with hatching in FIG. 3. As a result, the absorption coefficient $\alpha(\omega)$ is reduced as a function of the oscillation frequency $\omega$ of the photon in this energy region substantially exponentially with the oscillation frequency $\omega$ of the photon according to the following equation $$\{\alpha(\omega) = \alpha_0 \exp \quad -4/3\, [[\bar{m}\, (E_g - \hbar\omega)^3]/[\hbar^2\, (eF_i)^2]]^{1/2}\} \tag{5}$$

where $eF_i \approx 2V_i/d$. Similar conditions occur with the Franz Keldysh effect which explains the exponential tail of the absorption for $\hbar\omega < E_g$ for the case of strong external fields in undoped semiconductors. While in the Franz Keldysh effect the simultaneous production of free charge carriers is a drawback for some applications, they are here only brought into an adjacent n-conductive zone and recombine after a more or less long period of time. As long as the production rate of electron/hole pairs is greater than the recombination rate, $V_i$ decreases with time which results in a reduction of absorption since it corresponds to an increase in the triangular area of FIG. 3. The result in practice is shown in the following

EXAMPLE 4

In a semiconductor device having a body of a germanium crystal and $d$ = 500A and $n_i^{(2)} = 5 \cdot 10^{12}\, cm^{-2}$, $\alpha(\omega)$ should decrease in the range of photon energies of $\hbar\omega \approx E_g \approx 0.7\, eV$ down to $\hbar\omega \approx E_g - 0.2\, eV \approx 0.5\, eV$, according to equation (5) by about 2 or 3 powers of ten, while in the case of $n_i^{(2)} = 2.5 \cdot 10^{12}\, cm^{-2}$ it should decrease by about 5 powers of ten.

Based on the two last mentioned characteristics there result a plurality of embodiments and possible applications for obtaining, by suitable selection of the semiconductor material, of the parameters $d$, $n_D^{(2)}$ and $n_A^{(2)}$, a certain time, frequency and intensity dependence of the absorption coefficient as well as a certain desired time, frequency and intensity dependence of the luminescence intensity as well as the luminescence frequency. If, for example, the state described in Example 4 as $n_i^{(2)} = 5 \cdot 10^{12}\, cm^{-2}$ is the basic state and photons having the energy $\hbar\omega = 0.55\, eV$ are beamed in, the absorption is initially still about $\alpha(\omega) = 10^{-2}\alpha_0 = 10^2\, cm^{-1}$ and then decreases since, with increasing excitation, $n_i^{(2)}$ and thus also $F_i$ are reduced. At the same time, however, the emission of light increases, according to equation (4), as does the frequency of the emitted light. Finally, a state occurs, which is dependent on the intensity of the impinging light, at which an equilibrium exists between absorption and recombination processes.

A few examples of application of such a semiconductor device according to the invention will now be given:

A first example for use is as a delay element in light switch-on processes. In such an application, the semiconductor device is placed in the path of the light source. When the light source is switched on, it is assumed that the semiconductor material is still almost opaque for the frequency of the light, i.e., exp $(-\alpha(\omega) \cdot$ thickness of material) << 1. Only when $n_i^{(2)}$ $F_{and\ thus\ also\ fi}$ have been substantially decreased due to the absorption of a corresponding number of photons, will $\alpha(\omega)$ decrease, according to equation (5), to such an extent that a substantial portion of the light is transmitted. Since a change in $n_i^{(2)}$ depends on the product of light intensity and duration of irradiation, this also applies for the delay.

A second possible application is for increasing the steepness or slope of the leading edge of light pulses. Since $\alpha(\omega)$ changes exponentially with $n_i^{(2)}$, according to equation (5), there exists the possibility of making the leading edge, particularly of very intensive light pulses, steeper (as this is often desired for lasers) by placing a semiconductor device according to the invention into the beam path. Only at a time when the light pulse has already reached its full intensity, will the material become transparent due to the time exponential decrease of $\alpha(\omega)$ and this within an extremely short time.

Finally, a semiconductor device according to the invention can be used as a light meter operating with color comparison. According to equation (5), the absorption coefficient $\alpha(\omega)$ for a given material with a doping superstructure according to the invention and for a given frequency $\omega$ (with $E_g - eF_i d/2 < \hbar\omega < E_g$) depends on $F_i$ and thus on $n_i^{(2)}$, but not on the superstructure constant $d$. The recombination probability and the frequency of the emitted photons, however, according to equation (4) depends on $F_i = 2V_i/d$ and exponentially, or linearly, respectively, on $d$. Thus, there exists the possibility of using a material with an energy gap in the vicinity of 2 $e$V as the basic material for constructing a light meter which operates with a color comparison. By suitably selecting the doping concentration and the superstructure constant $d$, it can be achieved that at the weakest light intensities which can be measured in the photographic art only red light will be transmitted in the above-described equilibrium state between absorption and emission and at the highest possible intensities to be measured much shorter-waved light can also be transmitted. It has here been found to be useful that the shift in the absorption edge and thus the color change observed depends logarithmically on the light intensity, as this is desired for such a light meter. Such a light meter would thus consist substantially only of one piece of material with a doping superstructure according to the invention, a color comparison scale and possibly a filter.

In semiconductor devices of the present type, the absorption and luminescence properties can be controlled by electrical fields.

Figure 4:
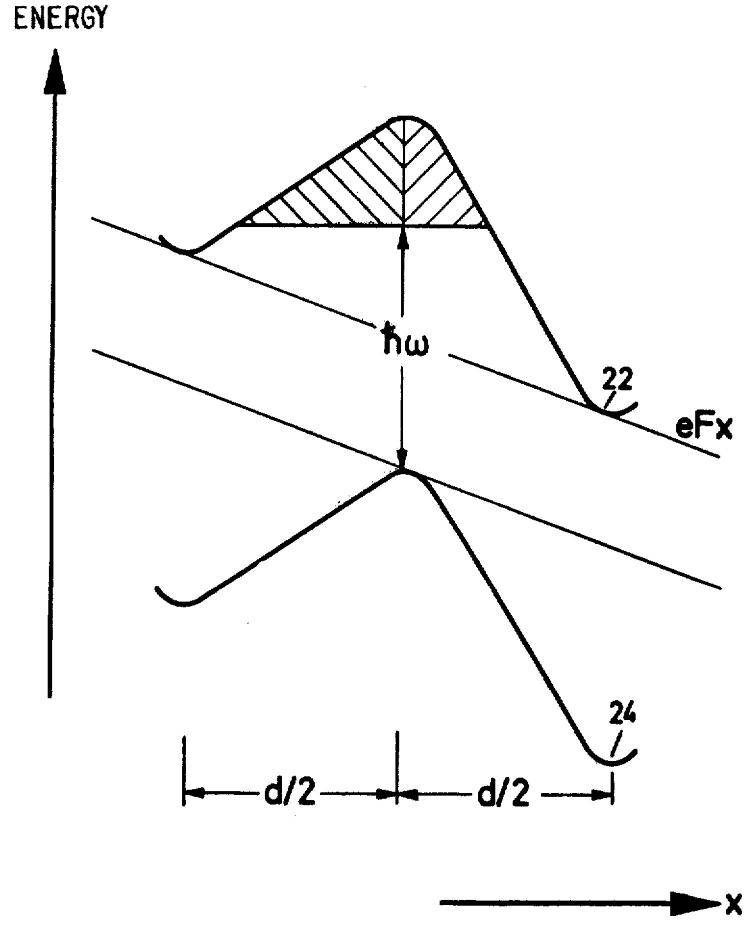

The influence of an extraneous electrical field produced, for example, by applying a voltage across contacts 26 and 28 on the absorption coefficient can be seen in FIG. 4. The relationships shown in FIG. 4 differ from those of FIG. 3 in that now when a photon is absorbed which has the energy $\hbar\omega < E_g$, the probability that the electron will change from a p-conductive zone into the n-conductive zone adjacent to the right or left is no longer equal. By superimposing the extraneous field F on the internal field $F_i \approx 2V_i/d$, the length of the tunnel barrier in FIG. 4 is shortened for transitions toward the right from about $(E_g - \hbar\omega)/F_i$ to about $(E_g - \hbar\omega)/(F_i + F)$, while the length of the barrier increases for transitions to the left to about $(E_g - \hbar\omega)/(F_i - F)$. Consequently, when there exists an extraneous field F, equation (5) changes to $$\alpha(\omega,F) = \alpha_0/2 \{ \exp [-4/3 [[\bar{m}(E_g - \hbar\omega)^3]/[\hbar^2 (eF_i)^2]]^{1/2} (F_i/F_i + F)] + \exp [-4/3 [[\bar{m}(E_g - \hbar\omega)^3]/[\hbar^2 (eF_i)^2]]^{1/2} (F_i/F_i - F)] \} \quad (6)$$

An extraneous field thus increases the absorption index $\alpha$ for photon energies below $E_g$. In particular, the lower limit for the absorption is shifted from about $E_g - V_i$ toward $E_g - V_i - e\mathrm{F}d/2$.

EXAMPLE 5

If under the conditions given in Example 1 $\alpha_0 = 10^4$ $cm^{-1}$ and the exponential factor in equation (6) is $10^{-3}$ for the selected photon energy in the absence of an extraneous field, an extraneous field which is only 50 percent of the internal field $F_i$ can serve to increase the absorption coefficient $\alpha(\omega)$ from 10 $cm^{-1}$ to about $10^2$ $cm^{-1}$. Thus, if a layer of semiconductor material according to the invention having a thickness of 0.1 cm would initially still permit about 30 percent of the light to pass, the permeability would be reduced to about $5 \cdot 10^{-5}$ by the extraneous field.

Figure 5:
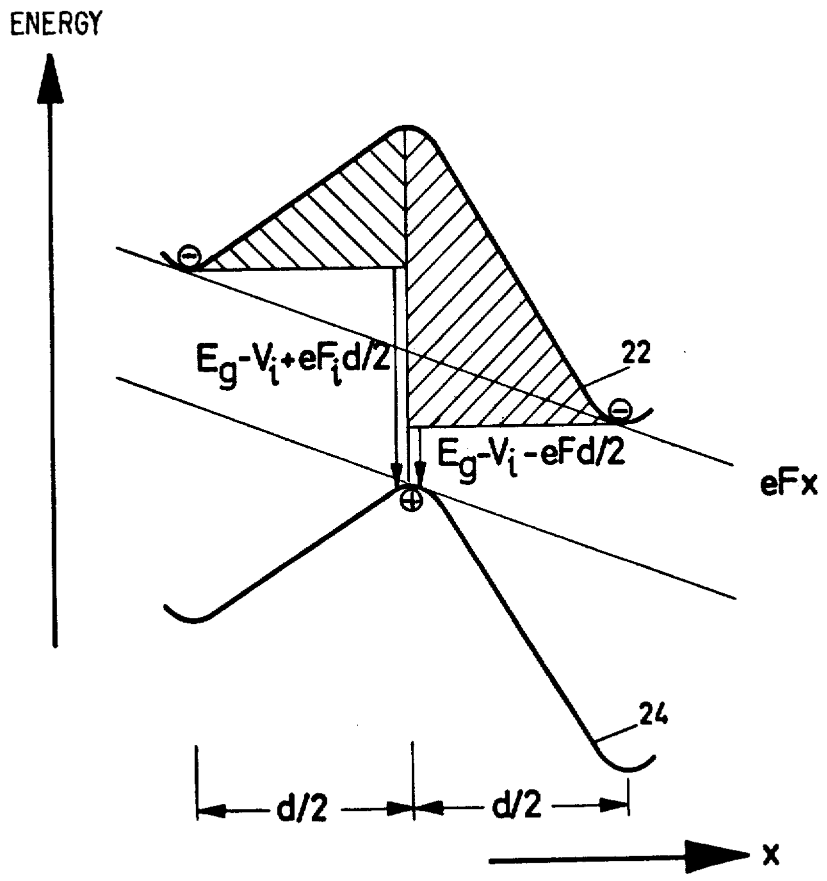

The influence of an extraneous field on the recombination of electrons with holes can be seen in FIG. 5. Here now it is not the length but the height of the tunnel barrier which is changed with respect to the field-free case of FIG. 3. In field direction $x$ the height is reduced by $e\mathrm{F}d/2$, in the opposite direction it is increased by $e\mathrm{F}d/2$. Furthermore, two emission lines can now be observed which are shifted by $\pm e\mathrm{F}d/2$ with respect to the field-free case. The exponential factor (4) thus changes to $$\exp\{-2/3 [[\bar{m}(V_i - e\mathrm{Fd}/2)]/\hbar^2]^{1/2} d\} \text{ for line } \hbar\omega = E_g - V_i + eF_i d/2$$

$$\exp\{-2/3 [[\bar{m}(V_i + e\mathrm{Fd}/2)]/\hbar^2]^{1/2} d\} \text{ for line } \hbar\omega = E_g - V_i - eF_i d/2 \quad (7)$$

EXAMPLE 6

An extraneous field of about $7 \cdot 10^4$ V/cm (that is about one-third of $F_i$) would increase the emission rate in a semiconductor device according to Example 1 by a factor of about $10^2$ and the higher energy emission line should be shifted by +0.17 $e$V with respect to the emission line in the field-free state while the other line would become negligibly weak. An increase in intensity and a blue shift by extraneous electrical fields will occur also for the thermal or thermally facilitated recombination.

Consequently, by the application of a voltage source across the contact electrodes 26 and 28 it is possible to cause the semiconductor device to emit light, and by suitably varying the voltage, the frequency and intensity of the emitted light may be controlled.

The controllability of the light absorption and emissions by means of electrical fields also provides numerous possible applications. Thus, for example, light of a given frequency can be intensity modulated by way of varying fields during its passage through material with a doping superstructure according to the invention. Or, with a continuous irradiation, the emission can be controlled within wide limits in its intensity as well as in its color by external electrical fields.

Figure 6:
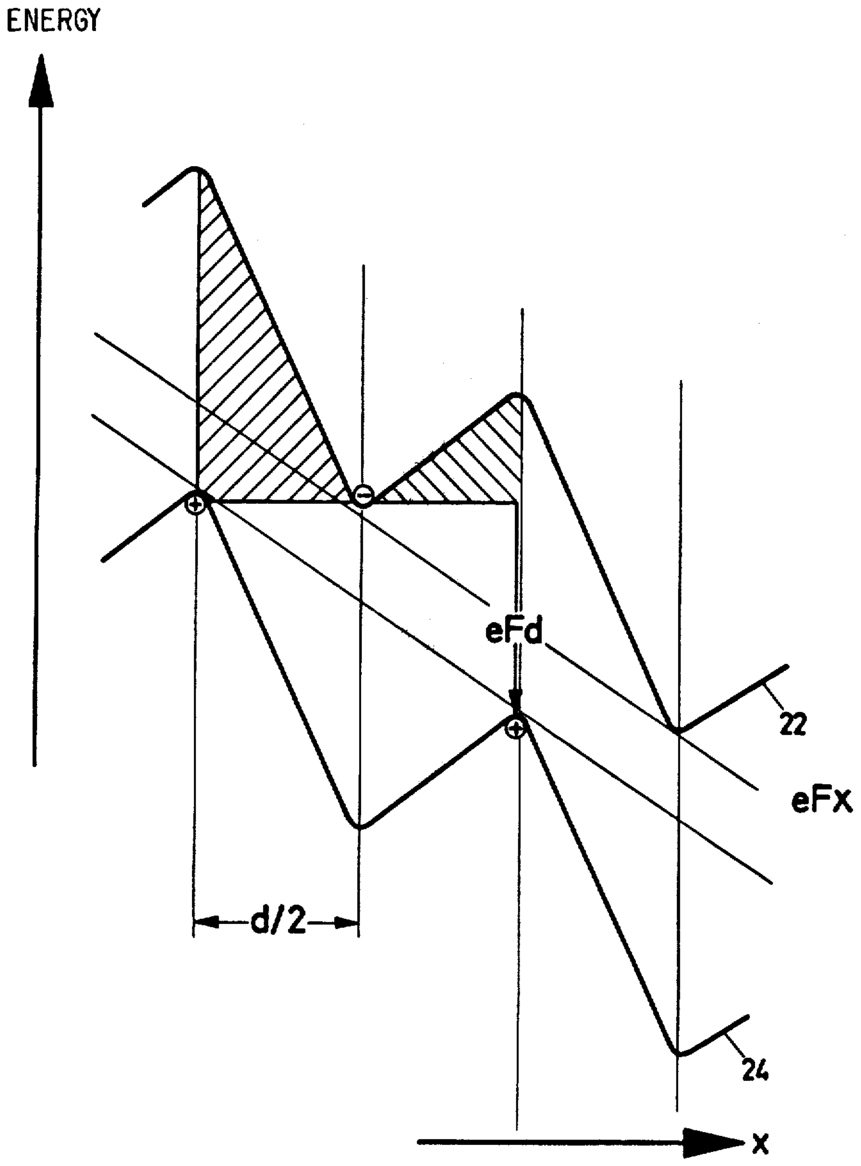

The semiconductor devices according to the present invention also exhibit interesting characteristics with regard to electroluminescence. FIG. 6 shows that with sufficiently high extraneous or external fields, transitions of electrons from p-conductive zones 14 to adjacent n-conductive zones 12 are possible without additional energy in the direction of the field. In this case, when the transitions from the n-conductive zones 12 to the adjacent p-conductive zones 14 extend in the direction of the field, photons with approximately the energy $\hbar\omega \approx e\mathrm{F}d$, are emitted by electroluminescence. A particular advantage of this type of electroluminescence is that the charge carriers here will not be freely movable in the direction of the field and thus no charge avalanche can be initiated by collision ionization. Moreover, for the same reason the heat produced by ohmic losses is low and the efficiency is high. It should further be possible to amplify this light emission by stimulated emission and in this way to build a semiconductor laser with a high degree of efficiency.

In addition to the low-loss generation of light there is offered the possibility of replacing the picture tube in television apparatus by a planar arrangement of the type to be described below. In such a picture tube replacement, a layer of a material having a doping superstructure according to the invention, and a surface area of the size of the desired picture, which may also consist of many small pieces of such a material with the only proviso that their doping layers must lie approximately parallel to the surface, is provided with a system of parallel strip-type electrodes on both its sides whose mutual spacing corresponds to the line spacing, and with two electrode systems being arranged perpendicular to one another. In this way the light emission for each picture dot may be controlled by electroluminescence so that this system would be suited for the reproduction of color television.

The conductivity of the body of semiconductor devices of the described structure not only differs completely from that of the pure material, but moreover it also substantially differs from that of multiple-layer components. Since the parameters resulting from equations (2*a* and 2*b*) must be substantially less than $E_g$ or no more than of the same order of magnitude, the devices of the present invention differ also substantially from a system of series connected tunnel diodes with regard to their conductivity in the direction of the doping structure. Depending on the structure and applied field, the current may be carried by $n—n$, $p—p$, or $p—n—p—n$ junctions of the charge carriers. It is thus possible to obtain a wide variety of current/voltage characteristics, particularly with negative properties, for a current flowing between electrodes 26 and 28.

Finally, the conductivity parallel to the doping layers, i.e., between electrodes 26' and 28', also shows very interesting properties, particularly regarding its dependence on the degree of excitation of the semiconductor material in the region of the doping superstructure. If, for example $n_A^{(2)} = n_D^{(2)}$ and if it is so low that with complete ionization of the doping atoms $V_i$ according to equation (3) is still less than $E_g$, the material in its basic state is almost insulating at a sufficiently low temperature even in a direction parallel to the zones since the zones of both conductivity types do not contain any free charge carriers. Since, however, depending on the selection of the semiconductor material and of the parameters $d$, $n_A^{(2)}$ and $n_D^{(2)}$, the lifetime of electrons and holes in the n-conductive zones 12 and p-conductive zones 14 can be selected at will within wide limits, the conductivity parallel to the layers can be controlled in time by external means, for example by optical excitation, injection of electrons and holes, extraneous fields or variation in temperature. A particular advantage in this connection is that the conductivity will increase, under certain circumstances, much larger than proportionally to the number of charge carriers. With an increasing number of charge carriers, the mobility will suddenly increase under suitable conditions. This is the case when the conduction mechansim of so-called "hopping" processes between localized acceptor or donor states changes to the metallic conduction mechanism.

In a semiconductor device according to FIG. 1*a* contacts 26' and 28' can be used wherein one contact for example 26', produces an ohmic contact with the n-conductive zones 12 and a blocking or rectifying contact with the p-conductive zones 14 and the other contact, e.g., contact 28', produces an ohmic contact with the p-conductive zone 14 and a blocking contact with the n-conductive zones 12. With a suitable applied bias supplied for example by a source and load connected in series between the electrodes 26' and 28', it is then possible to inject or extract charge carriers into or out of the respective zones and the flowing current, i.e., the conductivity of the device, can be controlled by radiation energy, particularly ultraviolet, visible, or infrared radiation, impinging in the direction of arrow 13.

The body of the semiconductor device of the present invention may be made of various materials with band gaps up to several $e$V, i.e., also of materials which usually are considered to be insulators. Moreover the doping superstructure of alternating n-conductive and p-conductive zones need not be strictly periodical, certain deviations from the periodicity may be present. The doping substances may be the acceptor and donor substances usually employed in the semiconductor art. Since with suitable dimensions of the doping superstructure, the color of the semiconductor body changes together with its absorption capability, the semiconductor device of the present invention can be used as mentioned above, for a light meter operating with color comparison.

Semiconductor bodies having the above-described doping superstructure may, in addition to the methods briefly mentioned above, also be produced by gaseous phase or molecular beam epitaxy with the periodic addition of the doping materials during growing of the crystal. The operation should, however, preferably taking place at relatively low temperatures in order to keep the diffusion of the doping substances in the already hardened material at a minimum.

In order to produce materials having a short period $d$ for the doping superstructure, it is preferred to use, instead of the conventional doping material, neutron activated isotopes of the semiconductor material with a sufficient lifetime to effect the doping, which radioactive isotopes will change over to doping atoms only after completion of the crystal growth due to $\beta$ decomposition. This permits a reduction of the diffusion of doping substance during the manufacturing process to a level much lower than when heterogeneous doping substances are used.

Thus, in case of $GaAs$ as semiconductor material, an n-type zone can be produced by using $As^{77}$ as doping material instead of selenium. $As^{77}$ is a fission product which is produced in a nuclear reactor, has a half-life of 39 hours and decays into $Se^{77}$ which acts as donor as desired. Similar radioactive isotopes useful for other semiconductor materials and for producing other dopants can be easily found by the expert in the art, e.g., using the General Electric "Chart of Nuclides" Knolls Atomic Power Laboratory, 1956.

The theory of the semiconductor devices according to this invention is more fully described in my publications "Electron States in Crystals with "nipi-Superstructure" phys. stat. sol. (b)52, 79–91 (1972) and "Electrical and Optical Properties of Crystals with "nipi-Superstructure" phys. stat. sol (b)52, 533–545 (1972) which are incorporated herewith by reference.

It will be understood that the above description of the present invention is susceptible to various modifications, changes and adaptations, and the same are intended to be comprehended within the meaning and range of equivalents of the appended claims.

APPENDIX

Explanation of Symbols Used $\alpha$ absorption index $\alpha(\omega)$ absorption index as a function of the wave-length of the absorbed radiation $d$ period duration of the *superstructure* ($= 2d_i + d_n + d_p$)

$d_i$ thickness of an intrinsic zone 16

$d_n$ thickness of an n-conductive zone 12

$d_p$ thickness of a p-conductive zone 14

$e$ charge of the electron $\epsilon$ ratio of the dielectric constant of the semiconductor material to that of the vacuum $E_g$ energy gap (width of the forbidden zone)

F field intensity of the extraneous electrical field $F_i$ field intensity of the internal electrical field $\hbar$ Planck's quantum of action (Planck constant)/$2\pi$ k Boltzmann constant $\bar{m}$ effective charge carrier mass (for Ge about $0.12 m_{electron}$)

$n_A$;$n_D$ number of acceptor or donor atoms, respectively $n_A^{(2)}$, $n_D^{(2)}$ number of acceptor or donor atoms per unit area of the respective p-conductive or n-conductive zone perpendicular to direction 13 (FIG. 1)

$n_i$ number of ionized doping atoms $n_i^{(2)}$ number of ionized doping atoms per unit area of the respective zone $n^{(2)}$ number of introduced charge carriers per unit area of the respective zone $\omega$ photon frequency T absolute temperature $V_i$ charge carrier potential

I claim:

1. A Semiconductor device comprising: a body of semiconductor material with a given energy gap and a given lattice constant, said body including a plurality of zones which in a given direction constitute a succession of alternatingly n-conductive and p-conductive zones having a given excess of donors and acceptors, respectively, each of whose thickness in said given direction is less than $10^3$ times said lattice constant, the thicknesses of said zones and the doping thereof being adjusted so that the amplitude and spatial period length of the wave-type potential distribution produced by the alternating p-conductive and n-conductive zones is of such a magnitude that the alternating effect between states in adjacent zones is small; and a pair of spaced contact electrodes on said semiconductor body.

2. A semiconductor device as defined in claim 1 wherein said semiconductor body further includes an intrinsic zone, whose thickness is at least 10 times said lattice constant, disposed between successive n-conductive and p-conductive zones in said given direction.

3. A semiconductor device as defined in claim 2 wherein the thickness of each said n-conductive and p-conductive zone is at least 5 times, and preferably 10 times, said lattice constant.

4. A semiconductor device as defined in claim 2 wherein the thickness of each said n-conductive and p-conductive zone is at most 30 times said lattice constant.

5. A semiconductor device as defined in claim 3 wherein said p-conductive and n-conductive zones all have approximately the same thickness and the thickness of said intrinsic zones disposed therebetween is always approximately twice the thickness of said p-conductive and n-conductive zones.

6. A semiconductor device as defined in claim 2 wherein said semiconductor body includes first and second outer zones in said given direction which have a lower doping concentration than the respective adjacent said p-conductive or n-conductive zone.

7. A semiconductor body as defined in claim 6 wherein said first and second outer zones are intrinsic zones.

8. A semiconductor device as defined in claim 6 wherein said first and second outer zones are zones in which the excess of donors or acceptors, respectively, is less than that in the adjacent p-conductive or n-conductive zone.

9. A semiconductor device as defined in claim 8 wherein the sequence of zones is $\frac{1}{2} p, (i, n, i, p)_z, i, \frac{1}{2} n$ where $z$ is a whole number greater than 1, and preferably greater than 10 and wherein the ½ indicates that the excess of donors or acceptors in said outer zones is one half of that in the adjacent p-conductive or n-conductive zone.

10. A semiconductor device as defined in claim 9 wherein $z$ is greater than 100.

11. A semiconductor device as defined in claim 2 wherein said two contact electrodes ohmically contact said semiconductor body at two opposed surfaces thereof disposed in said given direction.

12. A semiconductor device as defined in claim 11 further comprising means for a voltage across said electrodes to cause said device to emit light.

13. A semiconductor device as defined in claim 12 wherein said means includes a variable voltage source whereby the frequency and intensity of the emitted light can be controlled.

14. A semiconductor device as defined in claim 2 wherein said two contact electrodes form rectifying contacts with said semiconductor body and are disposed on two opposite surfaces of said semiconductor body in a direction perpendicular to said given direction.

15. A semiconductor device as defined in claim 14 further comprising a current source and a load connected in series with said electrodes and body means for impinging radiation, particularly with ultra-violet, visible or infrared radiation, on said semiconductor body in said given direction to control the conductivity of the semiconductor body.

16. A semiconductor device as defined in claim 2 wherein the doping of said zones is such that the excess of donors in a given n-conductive zone and the excess of acceptors in an adjacent p-conductive zone is sufficiently small so that the space charge potential which builds up when all doping atoms are ionized is less than one tenth of said energy gap.

17. A semiconductor device as defined in claim 2 wherein the doping and the dimensions of said zones is such that at least one of the following expressions has a value which is at most the same order of magnitude as said energy gap $[2\pi n_D^{(2)} e^2/\epsilon] \cdot d/2$ $[2\pi n_A^{(2)} e^2/\epsilon] \cdot d/2$ wherein $n_D^{(2)}$ and $n_A^{(2)}$ are respectively the number of donor and acceptor atoms per unit area perpendicular to said given direction of the respective n-conductive and p-conductive zones; and $d$ is the thickness of a period of repeating intrinsic, n-conductive and p-conductive zones.

18. A semiconductor device as defined in claim 17 wherein each of said expressions has a value substantially less than said energy gap.

19. In a method for producing a semiconductor device as defined in claim 1 including forming the plurality of p-conductive and n-conductive zones by precipitating layers of semiconductor material containing the various required doping substances in succession on a substrate, the improvement wherein a radio-active isotope of the semiconductor material is used for at least one of the doping substances.

20. A method of storing and subsequently releasing light with a semiconductor device as defined in claim 1 comprising:

exposing said semiconductor device to a source of light radiation for a period of time to cause said device to absorb light energy; and applying a voltage to said electrodes to cause said semiconductor device to release the absorbed light energy as a radiation in a shorter period of time.

21. A method of controlling the intensity of a beam of light with a semiconductor device as defined in claim 1 comprising:

placing said semiconductor device in the path of said beam of light; and controlling the absorption coefficient of said semiconductor body by applying a variable voltage across said contact electrodes of said device.

22. A method of converting light energy of a given wave length to light energy of a different wavelength with a semiconductor device as defined in claim 1 comprising:

exposing said semiconductor device to light energy of a given period of time to cause said semiconductor body to absorb light energy; and applying a voltage across said semiconductor body to cause said body to emit longer wave light of greater intensity but during a relatively shorter period of time than said given period of time.

23. A method of measuring light intensity with a semiconductor device as defined in claim 1 comprising:

exposing said semiconductor device to the light whose intensity is to be measured; and comparing the color of the light emitted by the semiconductor device with a standard color scale containing colors which correspond to the color of the semiconductor device at different light intensities.

* * * * *